United States Patent
Houben et al.

(10) Patent No.: US 10,453,685 B2
(45) Date of Patent: Oct. 22, 2019

(54) FORMING SEMICONDUCTOR DEVICE BY PROVIDING AN AMORPHOUS SILICON CORE WITH A HARD MASK LAYER

(71) Applicant: ASM IP Holding B.V., Almere (NL)

(72) Inventors: Kelly Houben, Lubbeek (BE); Steven R. A. Van Aerde, Tielt-Winge (BE); Maarten Stokhof, Winksele (BE); Bert Jongbloed, Oud-Heverlee (BE); Dieter Pierreux, Dilbeek (BE); Werner Knaepen, Leuven (BE)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 15/476,752

(22) Filed: Mar. 31, 2017

(65) Prior Publication Data

US 2018/0286679 A1 Oct. 4, 2018

(51) Int. Cl.
*H01L 21/311* (2006.01)
*H01L 21/033* (2006.01)

(52) U.S. Cl.
CPC .............................. *H01L 21/0337* (2013.01)

(58) Field of Classification Search
CPC ........... H01L 21/0337; H01L 21/02046; H01L 21/02063; H01L 21/02529; H01L 21/02532; H01L 21/02576; H01L 21/02579; H01L 21/0262; H01L 21/02639; H01L 21/28035; H01L 21/31116; H01L 21/31138; H01L 21/32139; H01L 21/76802; H01L 21/76814; H01L 29/4925; H01L 29/4941; H01L 29/66795; H01L 31/02167; H01L 31/1864; H01L 31/1868; C23F 4/00; C30B 1/023; C30B 29/06; C30B 29/54; G03F 7/427; Y02E 10/50; Y02P 70/521; Y10T 117/10; Y10T 428/24322
See application file for complete search history.

(56) References Cited

U.S. PATENT DOCUMENTS

| | | |
|---|---|---|
| 7,560,390 B2 | 7/2009 | Sant et al. |
| 7,648,690 B2 | 1/2010 | Bauer et al. |
| 8,461,053 B2 | 6/2013 | Chen et al. |
| 9,023,224 B2 | 5/2015 | Wang et al. |
| 9,412,612 B2 | 8/2016 | Yang |
| 9,461,058 B2 | 10/2016 | Song et al. |
| 9,540,743 B2 | 1/2017 | Takahashi et al. |
| 2002/0074313 A1* | 6/2002 | Hu .......................... C23F 4/00 216/41 |
| 2005/0106888 A1* | 5/2005 | Chiu ...................... G03F 7/427 438/710 |
| 2013/0161767 A1* | 6/2013 | Rouh ................ H01L 21/28035 257/412 |

(Continued)

*Primary Examiner* — Robert G Bachner
(74) *Attorney, Agent, or Firm* — Knobbe, Martens, Olson & Bear LLP

(57) ABSTRACT

The invention relates to a method of forming a semiconductor device by patterning a substrate by providing an amorphous silicon layer on the substrate and forming a hard mask layer on the amorphous silicon layer. The amorphous silicon layer is provided with an anti-crystallization dopant to keep the layer amorphous at increased temperatures (relative to not providing the anti-crystallization dopant). The hard mask layer may comprise silicon and nitrogen.

21 Claims, 4 Drawing Sheets

(56) References Cited

U.S. PATENT DOCUMENTS

| | | | |
|---|---|---|---|
| 2014/0120678 A1* | 5/2014 | Shinriki | H01L 29/66795 |
| | | | 438/283 |
| 2015/0101662 A1* | 4/2015 | Seutter | H01L 31/1864 |
| | | | 136/256 |
| 2015/0132962 A1 | 5/2015 | Hu et al. | |
| 2015/0159295 A1* | 6/2015 | Takahashi | C30B 1/023 |
| | | | 117/8 |
| 2015/0325441 A1 | 11/2015 | Tai et al. | |

* cited by examiner

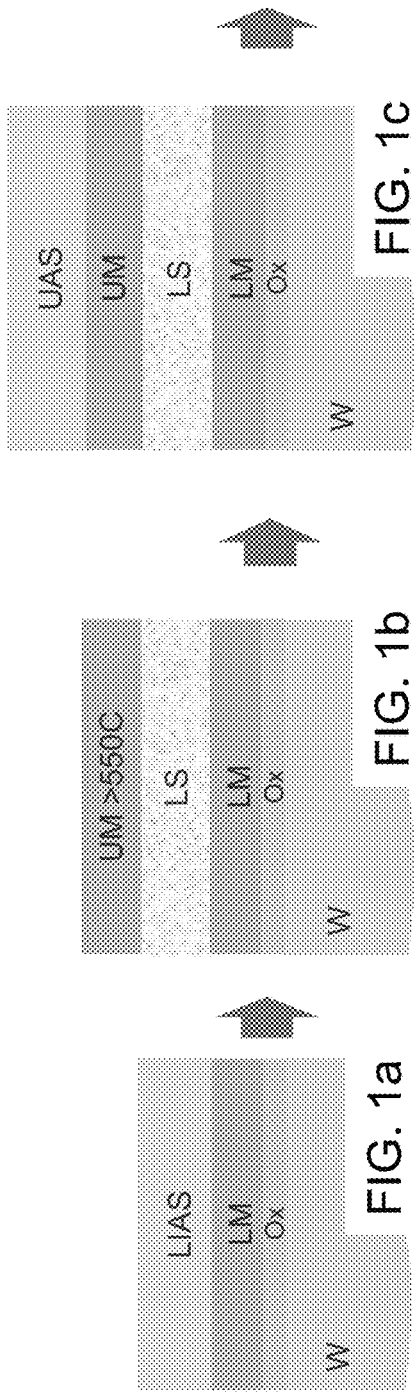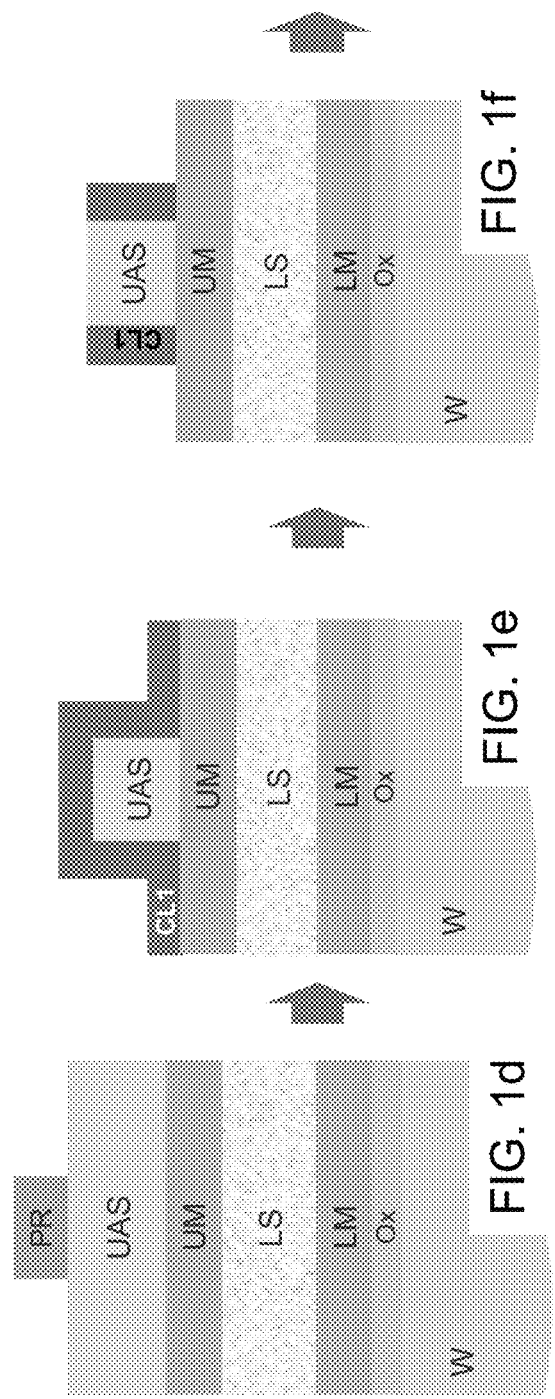

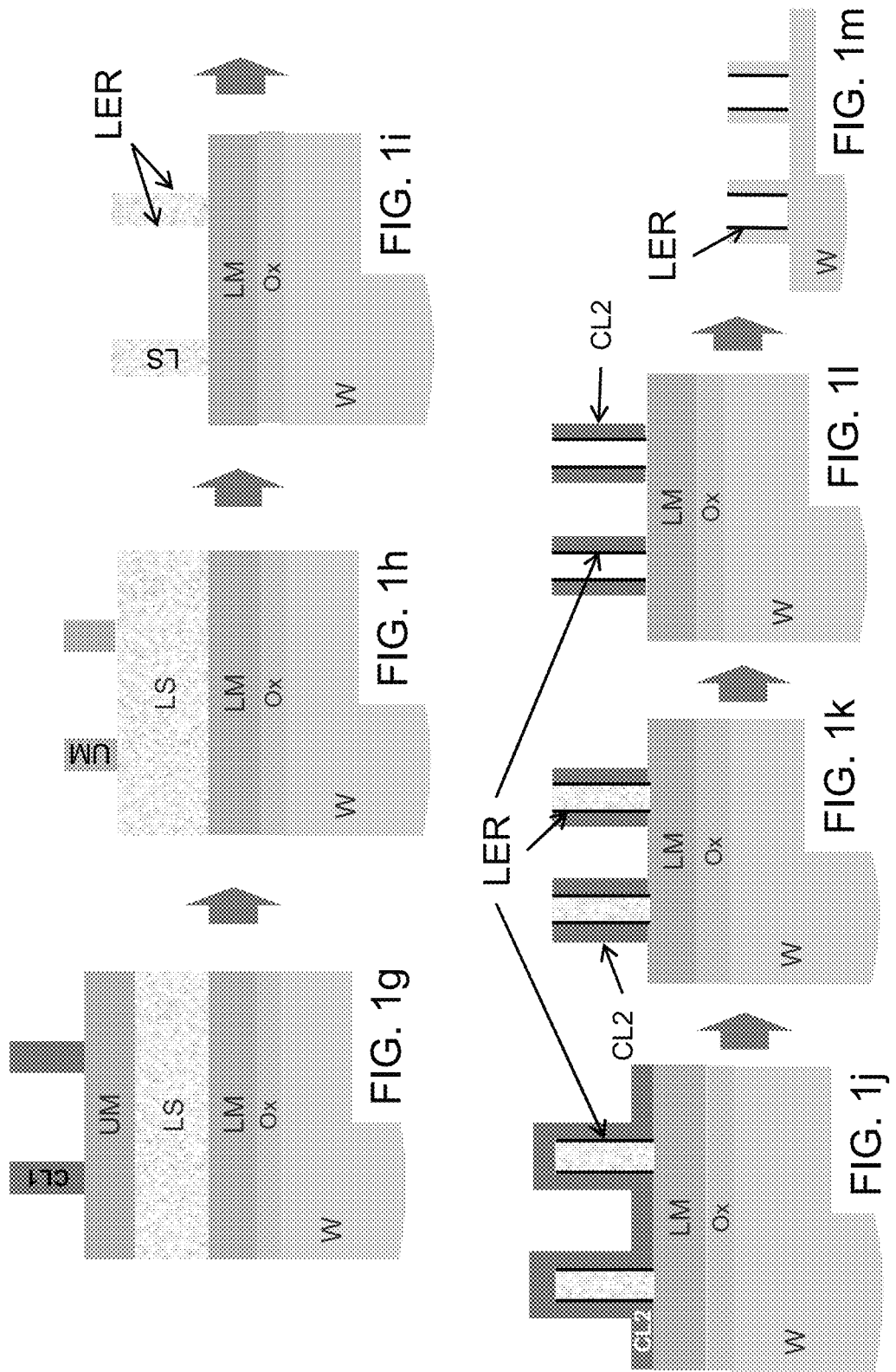

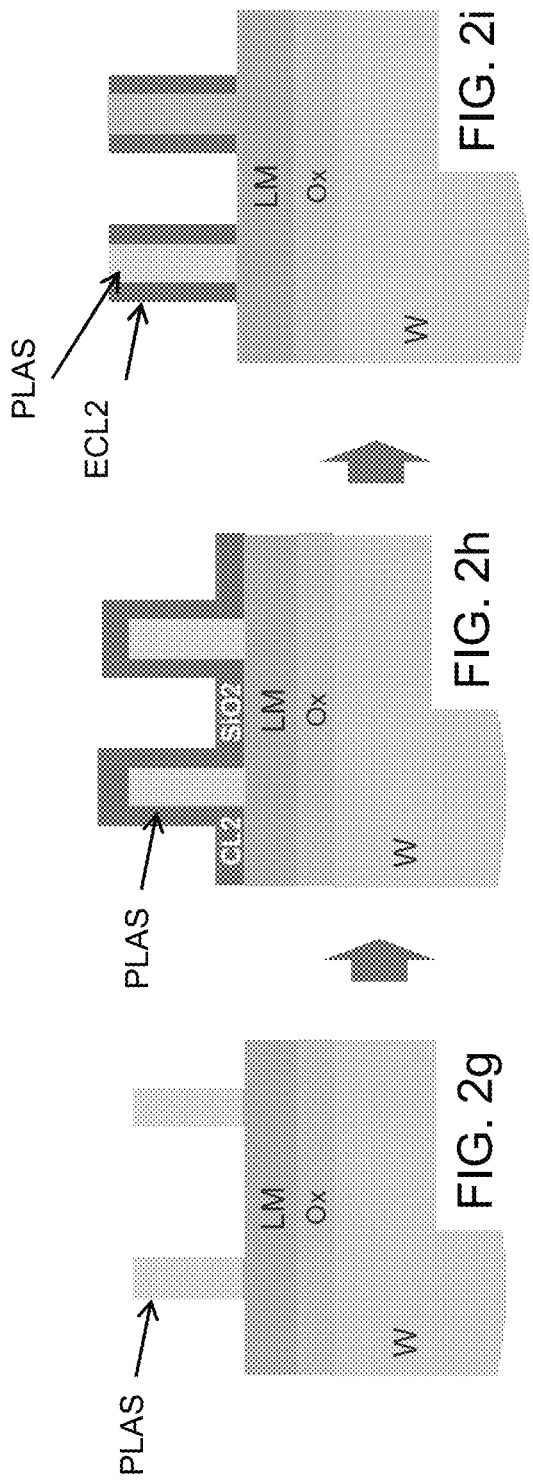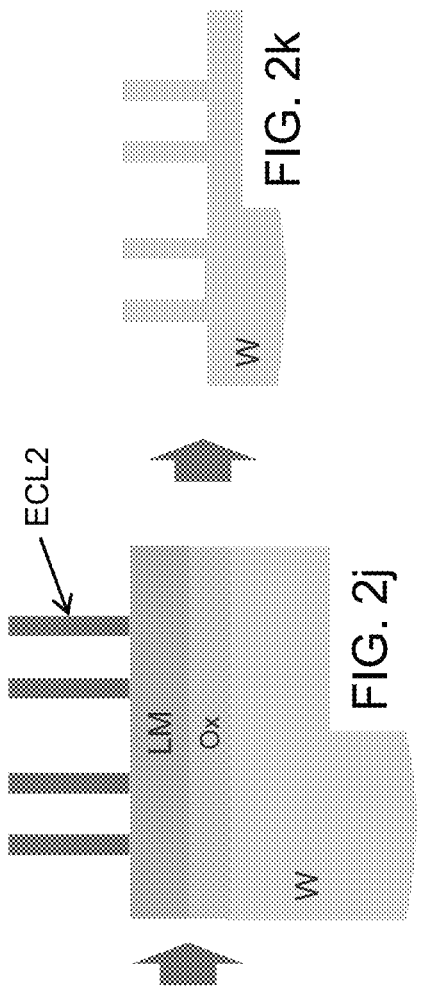

FORMING SEMICONDUCTOR DEVICE BY PROVIDING AN AMORPHOUS SILICON CORE WITH A HARD MASK LAYER

FIELD

The present disclosure generally relates to methods to manufacture semiconductor devices. More particularly, the disclosure relates to methods and structures for forming a semiconductor device by spacer defined multiple patterning.

BACKGROUND

As the trend has pushed semiconductor devices to smaller and smaller sizes, different patterning techniques have arisen. These techniques include directed self-assembly (DSA), spacer defined multiple patterning, extreme ultraviolet lithography (EUV), and EUV combined with spacer defined multiple patterning.

Spacer defined multiple patterning utilizes spacer features formed at the sides of a core of another material. The core material is removed to leave free-standing spacers, which may subsequently be used as masking features for patterning underlying material. Undesirably, the edges of the free-standing spacers may be rough, which may provide poor quality patterning results.

Accordingly, there is a need for methods for patterning small, high quality features.

SUMMARY

In accordance with at least one embodiment of the invention there is provided a method of forming a semiconductor device comprising:

patterning a substrate, wherein patterning the substrate comprises:
  providing a lower amorphous silicon layer on the substrate, wherein the lower amorphous silicon layer is provided with an anti-crystallization dopant; and,
  forming an upper hard mask layer above the lower amorphous silicon layer.

By using the anti-crystallization dopant, the lower amorphous silicon layer may be kept amorphous during and after forming an upper hard mask layer above the lower amorphous silicon layer and the line edge roughness in subsequent process steps may be reduced.

In accordance with a further embodiment there is provided a method of forming a semiconductor device by patterning a substrate by performing the following actions in the following order:

forming a lower hard mask layer on the substrate;
providing a lower amorphous silicon layer above the lower hard mask layer, the lower amorphous silicon layer being provided with an anti-crystallization dopant;
forming an upper hard mask layer above the lower amorphous silicon layer by a method comprising heating the substrate to a temperature above 550° C.;
providing an upper amorphous silicon layer above the upper hard mask layer;
providing a photoresist film above the upper amorphous silicon layer;
exposing and developing the photoresist film to form a photoresist pattern;
anisotropically etching the photoresist pattern into the upper amorphous silicon layer;
depositing a first conformal layer over the surfaces exposed at the surface of the substrate;
anisotropically etching the first conformal layer to remove the horizontal portions of the first conformal layer while leaving the vertical portions of the first conformal layer;
removing the upper amorphous silicon layer;
anisotropically etching the upper hard mask through the open portions between the vertical portions of the first conformal layer;
removing the remaining portions of the first conformal layer;
anisotropically etching the lower amorphous silicon layer through the open portions of the upper hard mask layer;
removing the upper hard mask layer;
depositing a second conformal layer over the surfaces exposed at the surface of the substrate;
anisotropically etching the second conformal layer to remove the horizontal portions of the second conformal layer while leaving the vertical portions of the second conformal layer;
removing the lower amorphous silicon layer;
anisotropically etching the lower hard mask through the open portions between the vertical portions of the second conformal layer;
removing the remaining portions of the second conformal layer; and,
anisotropical etching the substrate through the open portions of the lower hard mask layer thereby patterning the substrate.

By using the anti-crystallization dopant the lower amorphous silicon layer may be kept amorphous during and after forming an upper hard mask layer above the lower amorphous silicon layer and the line edge roughness in subsequent etching steps may be reduced.

For purposes of summarizing the invention and the advantages achieved over the prior art, certain objects and advantages of particular embodiments have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE FIGURES

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

FIGS. 1a to 1m depict a self-aligned quadruple patterning (SAQP) method.

FIGS. 2a to 2k depict a self-aligned quadruple patterning (SAQP) method according to some embodiment of the invention.

DETAILED DESCRIPTION

Figure 2A:
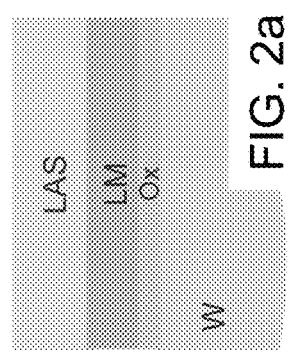
Figure 2B:
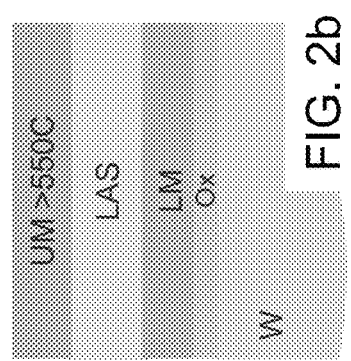

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

It has been found that the roughness of the edges of spacer masking features (also referred to herein as spacers) may be due to the roughness of the surfaces of the core material on which the spacers are formed. It will be appreciated that the core material may comprise silicon and may itself have been formed from a layer of silicon that has been etched to form the pattern of core material on which the spacers will later be formed. This etching of the silicon layer may leave features with rough sidewalls, and this roughness may be transferred to the conformal layer of spacer material that is later deposited on the core material.

In some embodiments, the layer of the core material is provided with an anti-crystallization dopant, which maintains the core material in the amorphous state during etching of that layer. Advantageously, the amorphous nature of the core material allows for highly smooth sidewalls to be formed. In turn, it has been found that this allows the formation of spacers with highly uniform sidewalls. In some embodiments, these spacers may be utilized as masking features to etch underlying materials and form etched patterns with smooth boundaries.

With reference now to FIGS. 1a-1m, a self-aligned quadruple patterning (SAQP) method is shown. A lower hard mask layer LM and a lower initially amorphous silicon layer LIAS may be provided on a substrate W (see FIG. 1a).

Subsequently, an upper hard mask layer UM may be formed above the lower initially amorphous silicon layer LIAS. Formation of the upper hard mask layer UM may be a relatively high temperature process in order to form a good quality layer. For example, the upper hard mask layer UM may be made by a process that includes heating the substrate W to a temperature above 550° C. (see FIG. 1b). However, at these temperatures, the lower initially amorphous silicon layer LIAS may be partially crystallized into a partially crystallized silicon layer LS.

An upper amorphous silicon layer UAS may be formed above the upper hard mask layer UM (see FIG. 1c). The upper hard mask layer UM may alternatively be made at a lower temperature using a plasma, however, this may also induce damage resulting in the nucleation of grains in the lower initially amorphous silicon layer LIAS. During deposition of the second amorphous silicon layer UAS (e.g., at around 500° C.), this thermal budget may be sufficient for the nucleated grains in the LIAS to grow also into a partially crystallized silicon layer LS. Consequently, formation of one or more of the layers above the lower initially amorphous silicon layer LIAS may be performed at a temperature sufficient to cause at least partial crystallization of the LIAS, thereby converting that layer into the partially crystallized silicon layer LS.

A photoresist film may be provided above the upper amorphous silicon layer UAS and this photoresist film may be exposed and developed (see FIG. 1d) to form a photoresist pattern PR. While not illustrated, several other patterning assist layers may be present beneath the photoresist film, such as for example an anti-reflective coating layer (e.g. a SiOC layer).

The photoresist pattern PR may be anisotropically etched into the upper amorphous silicon layer UAS and a first conformal layer CL1 may be provided over the surfaces exposed at the surface of the substrate (see FIG. 1e).

The first conformal layer CL1 may be anisotropically etched with an energy sufficient to remove the horizontal portions of the first conformal layer CL1. The vertical portions of the first conformal layer CL1 may remain (see FIG. 1f) and the upper amorphous silicon layer UAS may be removed (see FIG. 1g). As used herein, it will be appreciated that the horizontal portions extend primarily horizontally (e.g., have a larger lateral dimension than vertical dimension), and that vertical portions extend primarily vertically (e.g., have a larger vertical dimension then horizontal dimension, and extend along the sidewalls of the patterned amorphous silicon layer).

The vertical portions of the first conformal layer CL1 may be used to anisotropically etch through the open portions between the vertical portions of the first conformal layer CL into the upper hard mask layer UM to pattern it. Subsequently, the first conformal layer is removed (see FIG. 1h).

The partially crystallized silicon layer LS may be anisotropically etched through the open portions of the upper hard mask layer UM and then the upper hard mask layer may be removed (see FIG. 1i). Without being limited by theory, due to the partial crystallization of the silicon layer LS, the anisotropic etch may be influenced by the crystals formed in the layer LS and the layer may have a rough surface with undesirably high line edge roughness (LER).

A second conformal layer CL2 may be deposed over the surfaces exposed at the surface of the substrate (see FIG. 1j). Since the side and top surface of the partially crystallized silicon layer LS may be rough, the second conformal layer CL2 may have a rough interface with the partially crystallized silicon layer LS. On the sides of the conformal layer CL2, this may be referred to as undesirably high line edge roughness LER.

The second conformal layer CL2 may be anisotropically etched with an energy enough to remove the horizontal portions of the second conformal layer CL2 while leaving the vertical portions of the second conformal layer to remain (see FIG. 1k). The lower partially crystallized silicon layer LS may subsequently be removed (see FIG. 1l).

The lower hard mask LM may be anisotropically etched through the open portions between the vertical portions of the etched second conformal layer ECL2. The etched second conformal layer ECL2 may be removed and the substrate W may be anisotropically etched through the open portions of the lower hard mask layer LM thereby patterning the substrate W. Subsequently, the lower hard mask layer LM may be removed (see FIG. 1m).

The line edge roughness LER may be preserved during the process steps preparing the conformal layer for edging through the lower hard mask layer LM causing the line edge roughness to end up in the patterned wafer W in FIG. 1m.

As noted above, the line edge roughness may be caused by the process step of providing a lower amorphous silicon layer on the substrate; and, forming an upper hard mask layer above the lower amorphous silicon layer by a method comprising heating the substrate to a temperature above 550° C. At this temperature, the material in the lower amorphous silicon layer may become crystalline. In subsequent etching processes, the crystalline material may etch very roughly because of the crystals formed. This may cause a high line edge roughness in the patterns formed, which is unwanted in semiconductor manufacturing. As a result, it has been found that it may be advantageous to keep the lower amorphous silicon layer amorphous after forming an upper hard mask layer above the lower amorphous silicon layer.

To prevent undesired line edge roughness LER in the pattern on the substrate W, the lower amorphous silicon layer LAS in FIG. 2a may be provided with an anti-crystallization dopant. The dopant concentration in the lower amorphous silicon layer LAS may be smaller than 25 at. %, smaller than 20 at. %, preferably less than 15 at. % more preferably less than 10 at. %, even more preferably less than 5 at. %, and most preferably less than 2.5 at. %, and sufficiently high to keep the lower amorphous silicon layer amorphous while maintaining sufficient etch resistivity to keep the etch selectivity towards the hard mask layers at a sufficiently high level to allow high fidelity pattern transfer into that layer and from that layer to underlying materials. In some embodiments, the dopant concentration is at the levels noted herein (e.g. smaller than the values noted above), and is also maintained above 0.1 at. %, or more, preferably 1 at. % or more, and more preferably 2 at % or more. The atomic percentage (at. %) gives the percentage of one kind of atom relative to the total number of atoms.

The lower amorphous silicon layer LAS may be deposited using a silicon-comprising reactant. In some embodiments, the silicon-comprising reactant may include one or more of silanes (e.g. $Si_nH_{(2n+2)}$) and halo silanes (e.g. $SiCl_3H$).

In some embodiments, the anti-crystallization dopant in the lower amorphous silicon layer LAS may comprise oxygen, hydrogen, nitrogen, carbon or sulfur. The oxygen, hydrogen, nitrogen, carbon or sulfur may cause the lower amorphous silicon layer to remain amorphous during exposure to elevated temperatures due to the subsequent depositions of other layers of material or other processing.

The deposition of the lower amorphous silicon layer LAS may comprise using $N_2O$ as an oxygen source during deposition of the layer LAS. $N_2O$ may be co-flowed (that is, simultaneously flowed for at least part of the deposition) with a silicon-comprising reactant to deposit the layer LAS.

The deposition of the lower amorphous silicon layer LAS may comprise using an anti-crystallization dopant comprising carbon and/or hydrogen during deposition of the layer LAS. The anti-crystallization dopant may be provided by co-flowing a C-precursor comprising carbon, such as for example alkane (e.g., $C_2H_2$, $C_2H_4$, or $C_3H_6$).

The anti-crystallization dopant may be provided by using an organosilane (e.g. $(SiH_3)_2CH_2$, or $SiH_3CH_3$) during the deposition of a silicon-comprising reactant. The anti-crystallization dopant may be carbon and/or hydrogen from the alkane of the organosilane remaining within the lower amorphous silicon layer after deposition.

The deposition of the lower amorphous silicon layer LAS may comprise using an anti-crystallization dopant comprising nitrogen during deposition of the layer LAS. The nitrogen anti-crystallization dopant may be provided by co-flowing a N-precursor comprising nitrogen (such as for example $NH_3$, $N_2H_4$) during deposition of the layer LAS using a silicon-comprising reactant.

Alternatively, the silicon-comprising reactant may comprise nitrogen. For example, TSA (Trisilaneamine) may be used as a precursor. TSA comprising nitrogen may form Si films with a large concentration of Nitrogen. After annealing, the nitrogen may keep the films amorphous.

The deposition of the lower amorphous silicon layer LAS may comprise using an anti-crystallization dopant comprising sulphur during deposition of the layer LAS. The sulphur as an anti-crystallization dopant may be provided by co-flowing a S-precursor comprising sulphur during deposition of the silicon-comprising reactant.

Forming the upper hard mask layer UM on the lower amorphous silicon layer LAS may comprise heating the substrate to a temperature above 550° C., preferably 600° C., more preferably 630° C., even more preferably 700° C., or about 800° C. or higher. The lower amorphous silicon layer LAS may be provided with an anti-crystallization dopant to keep the lower amorphous silicon layer amorphous during heating the substrate to these temperatures.

The silicon-comprising reactant for depositing the lower amorphous silicon layer LAS may comprise $Si_nH_{(2n+2)}$, wherein n is at least 2 (e.g., disilane or trisilane) and the method comprises depositing the silicon-comprising reactant at a deposition temperature below 500° C., preferably 450° C., and the anti-crystallization dopant is the hydrogen from the $Si_nH_{(2n+2)}$ remaining within the lower amorphous silicon layer at those temperatures. The hydrogen concentration may be less than 5 at. %, preferably less than 2.5 at. % and most preferably less than 1.5 at. %. The dopant concentration is at the levels noted herein (e.g. smaller than the values noted above), and is also maintained above 0.1 at. % or more, preferably 1 at. % or more, and more preferably 2 at % or more. The atomic percentage (at. %) gives the percentage of one kind of atom relative to the total number of atoms. It may also be that a hydrogen comprising reactant may be co-flowed with the silicon-comprising reactant to obtain a hydrogen-doped silicon film which does not crystallize. In some embodiments, the deposition temperature may be between 300 to 500° C., between 325 to 450° C., or between 350 to 400° C. for example around 375° C. to increase the hydrogen content of the amorphous silicon layer LAS.

The method for depositing the lower amorphous silicon layer LAS may comprise first depositing a starting layer of amorphous silicon provided with an anti-crystallization dopant, and subsequently depositing a subsequent silicon based top layer on top of the starting layer without an anti-crystallization dopant to finalize the lower amorphous silicon layer. The subsequent silicon based top layer may be deposited at a higher temperature to increase the speed of the deposition process. The temperature may therefore be increased above 500° C., including 550° C. Silane ($SiH_4$) may be used for depositing the subsequent silicon-based top layer to lower cost and improve deposition speed. The starting layer may be less than 10 nm, e.g., 5 nm thick, and may keep the rest of the lower amorphous silicon layer amorphous during heating the substrate to the temperature above 500° C., e.g., 550° C.

The method for depositing the lower amorphous silicon layer LAS may comprise depositing first a $Si_nH_{(2n+2)}$ based starting layer wherein n is at least 2 at a temperature below 500° C., preferably below 450° C. and even more preferably below 400° C., including about 375° C. Subsequently, a subsequent silicon based top layer may be deposited on top of the starting layer at a deposition temperature between 500 C and 550° C. and preferably between 500° C. and 535° C. to finalize the lower amorphous silicon layer LAS at an increased speed with respect to the starting layer.

Without being limited by theory, crystallization is believed to typically start at the boundary of the lower amorphous silicon layer LAS with the lower layer and from there on the crystallization may progress into the lower amorphous silicon layer LAS. By providing a doped starting layer for the lower amorphous silicon layer LAS that is kept amorphous during the anneal, crystallization at the boundary may be circumvented and therefore there may not be a progress of the crystallization in the rest of the lower amorphous silicon layer LAS.

FIGS. 2a to 2k depict a self-aligned quadruple patterning (SAQP) method according to an embodiment of the invention for patterning a substrate W. A lower hard mask layer LM and a lower amorphous silicon layer LAS may be provided on the substrate W (see FIG. 1a). The substrate W may be made from silicon and may be covered with a native oxide layer Ox. The lower amorphous silicon layer LAS may be provided with an anti-crystallization dopant as described before. The dopant concentration in the lower amorphous silicon layer LAS may be smaller than 25 at. %, smaller than 20 at. %, preferably less than 15 at. % more preferably less than 10 at. %, even more preferably less than 5 at. %, and most preferably less than 2.5 at %, while being at a sufficiently high level to keep the lower amorphous silicon layer amorphous while maintaining sufficient etch resistivity to keep the etch selectivity towards the hard mask layers preserved. Preferably, the dopant concentration is at the levels noted herein (e.g. smaller than the values noted above), and is also maintained above 0.1 at. % or more, preferably 1 at. % or more, and more preferably 2 at % or more. The atomic percentage (at. %) gives the percentage of one kind of atom relative to the total number of atoms.

The lower hard mask layer LM may comprises silicon and nitrogen. The lower hard mask layer LM may comprise Silicon Nitride (SiN), Silicon Carbide Nitride (SiCN) or any other suitable hard mask material.

Subsequently, an upper hard mask layer UM may be formed above the lower amorphous silicon layer LS by a method comprising heating the substrate W to a temperature above 550° C. (see FIG. 2b). The increased temperature may be required to provide a good quality upper hard mask layer UM; however, at these temperatures the lower amorphous silicon layer LAS may crystallize but by the anti-crystallization dopant the layer may be kept amorphous. The upper hard mask layer UM comprises silicon and nitrogen. The upper hard mask layer may comprise Silicon Nitride (SiN), Silicon Carbide Nitride (SiCN) or any other suitable hard mask material.

Figure 2C:
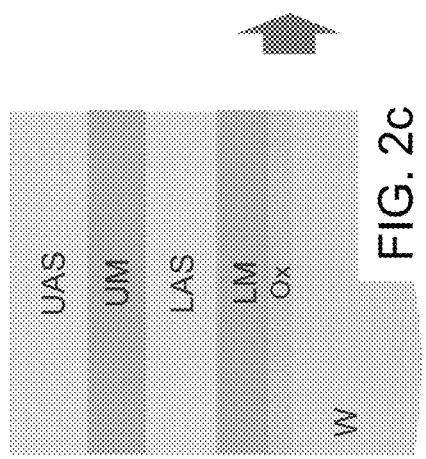
Figure 2D:
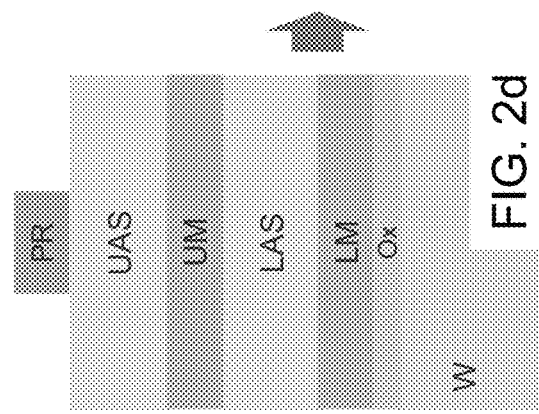
Figure 2E:
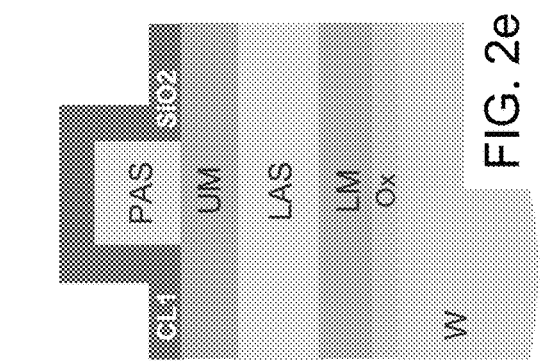
Figure 2F:
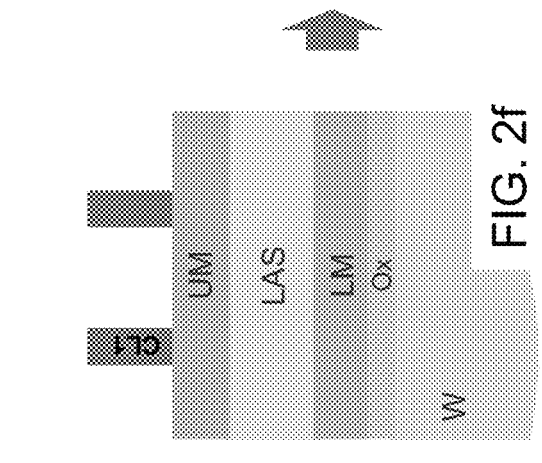

An upper amorphous silicon layer UAS may be formed above the upper hard mask layer UM (see FIG. 2c). A photoresist film may be provided above the upper amorphous silicon layer UAS which is exposed and developed (see FIG. 2d) to form a photoresist pattern PR.

The photoresist pattern PR may be anisotropically etched into the upper amorphous silicon layer UAS to form a patterned amorphous silicon layer PAS. The constituent features of the patterned amorphous silicon layer PAS may be understood to form individual cores of materials which support the formation of spacers. To form the spacers, a first conformal layer CL1 may be provided over the surfaces exposed at the surface of the substrate (see FIG. 2e), including surfaces of the patterned amorphous silicon layer PAS. The first conformal layer CL1 may be made from silicon oxide (e.g. SIO$_2$) in some embodiments.

The first conformal layer CL1 may be anisotropically etched with an energy high enough to remove the horizontal portions of the first conformal layer CL1. The vertical portions of the first conformal layer CL1 may remain and the patterned upper amorphous silicon layer PAS may be removed (see FIG. 2f). The layer PAS may be removed selectively with respect to the first conformal layer CL1 and the upper hard mask layer UM with for example a TMAH (Tetramethylammonium hydroxide) solution.

The vertical portions of the first conformal layer CL1 may be used to anisotropically etch through the open portions between the vertical portions of the first conformal layer CL1 into the upper hard mask layer UM to pattern it. Subsequently, the first conformal layer may be removed. The lower amorphous silicon layer LAS may be anisotropically etched through the open portions of the upper hard mask layer UM to form a patterned lower amorphous silicon layer PLAS, which provides cores of material around which spacers are later formed. The upper hard mask layer may subsequently be removed (see FIG. 2g). Since the lower amorphous silicon layer LAS is not partially crystallized the anisotropic etching is preferably not influenced by any crystals formed in this layer and the layer may have a smooth surface.

A second conformal layer CL2 may be deposited over the surfaces exposed at the surface of the substrate (see FIG. 2h), including the exposed surfaces of the patterned lower amorphous silicon layer PLAS. Since the side and top surfaces of the patterned lower amorphous silicon layer PLAS are smooth, the second conformal layer CL2 may have a smooth interface with the lower amorphous silicon layer PLAS.

The second conformal layer CL2 may be anisotropically etched with an energy enough to remove the horizontal portions of the second conformal layer CL2 while leaving the vertical portions of the second conformal layer to remain (see FIG. 2i)), thereby forming an etched second conformal layer ECL2 (also referred to an spacers). The lower amorphous silicon layer LAS may subsequently be removed (see FIG. 2j).

The lower hard mask LM may be anisotropically etched through the open portions between the vertical portions of the second conformal layer CL2, the vertical portions of the second conformal layer CL2 may be removed and the substrate W may be anisotropically etched through the open portions of the lower hard mask layer LM thereby patterning the substrate. The lower hard mask layer LM may subsequently be removed (see FIG. 1k).

The line edge roughness LER in the pattern of the wafer W may be reduced during the process steps preparing the conformal layer for etching through the lower hard mask layer LM by keeping the amorphous silicon layer LAS amorphous.

The particular implementations shown and described are illustrative of certain embodiments and are not intended to otherwise limit the scope of the aspects and implementations in any way. Indeed, for the sake of brevity, conventional manufacturing, connection, preparation, and other functional aspects of the system may not be described in detail. Furthermore, the connecting lines shown in the various figures are intended to represent exemplary functional relationships and/or physical couplings between the various elements. Many alternative or additional functional relationship or physical connections may be present in the practical system, and/or may be absent in some embodiments.

It is to be understood that the configurations and/or approaches described herein are examples in nature, and that these specific embodiments or examples are not to be considered in a limiting sense, because numerous variations are possible. The specific routines or methods described herein may represent one or more of any number of processing strategies. Thus, the various acts illustrated may be performed in the sequence illustrated, in other sequences, or omitted in some cases.

The subject matter of the present disclosure includes all novel and nonobvious combinations and sub combinations of the various processes, systems, and configurations, and other features, functions, acts, and/or properties disclosed herein, as well as any and all equivalents thereof.

What is claimed is:

1. A method of forming a semiconductor device comprising:

patterning a substrate, wherein patterning the substrate comprises:
  providing a lower amorphous silicon layer on the substrate, wherein the lower amorphous silicon layer is provided with an anti-crystallization dopant;
  forming an upper hard mask layer above the lower silicon layer;
  forming openings in the upper hard mask layer, the openings exposing portions of the lower amorphous silicon layer;
  anisotropically etching the lower amorphous silicon layer through the openings in the upper hard mask layer to define a patterned lower amorphous silicon layer;
  removing the upper hard mask layer;
  depositing a conformal layer on the patterned lower amorphous silicon layer;
  anisotropically etching the second conformal layer to leave vertical portions of the second conformal layer along sidewalls of the patterned lower amorphous silicon layer; and
  removing the lower amorphous silicon layer while retaining the vertical portions of the second conformal layer.

2. The method according to claim 1, wherein the upper hard mask layer comprises silicon and nitrogen.

3. The method according to claim 1 or 2, wherein a concentration of the dopant is less than 25 at %, wherein the concentration is sufficient to maintain the lower amorphous silicon layer in an amorphous state during patterning the substrate.

4. The method according to claim 1, wherein the amorphous silicon layer is formed by depositing a silicon-comprising reactant.

5. The method according to claim 4, wherein the silicon-comprising reactant is selected from the group consisting of silanes and halosilanes.

6. The method according to claim 4, wherein the silicon-comprising reactant comprises an organosilane and the anti-crystallization dopant is one or both of carbon and hydrogen from the organosilane remaining within the lower amorphous silicon layer after deposition.

7. The method according to claim 4, wherein the silicon-comprising reactant comprises $Si_nH_{(2n+2)}$ wherein n is at least 2, further comprising:
  depositing silicon from the silicon-comprising reactant at a deposition temperature below 500° C., wherein the anti-crystallization dopant comprises hydrogen from the $Si_nH_{(2n+2)}$.

8. The method according to claim 1, wherein the anti-crystallization dopant comprises one or more of oxygen, hydrogen, nitrogen, carbon, and sulfur.

9. The method according to claim 8, wherein providing a lower amorphous silicon layer comprises using $N_2O$ as an oxygen source during deposition of the amorphous silicon layer.

10. The method according to claim 8, wherein the anti-crystallization dopant is provided by using an anti-crystallization dopant comprising carbon during deposition of the amorphous silicon layer.

11. The method according to claim 8, wherein the anti-crystallization dopant is provided by co-flowing a N-precursor comprising nitrogen during depositing silicon from a silicon-comprising reactant to form the lower amorphous silicon layer.

12. The method according to claim 8, wherein the anti-crystallization dopant is provided by co-flowing a S-precursor comprising Sulphur during depositing silicon from a silicon-comprising reactant to form the lower amorphous silicon layer.

13. The method according to claim 1, wherein forming the upper hard mask layer on the lower amorphous silicon layer comprises heating the substrate to a temperature above 550° C., wherein the lower amorphous silicon layer with the anti-crystallization dopant remains amorphous during heating the substrate.

14. The method according to claim 1, further comprising:
  first depositing a starting layer of amorphous silicon provided with an anti-crystallization dopant; and
  subsequently depositing a silicon based top layer on top of the starting layer to finalize the lower amorphous silicon layer.

15. The method according to claim 14, wherein depositing the starting layer comprises using $Si_nH_{(2n+2)}$ as a silicon precursor, wherein n is at least 2, at a deposition temperature below 500° C.

16. The method according to claim 14, wherein subsequently depositing a silicon based layer on top of the starting layer is performed at a deposition temperature between 500° C. and 550° C.

17. The method according to claim 14, wherein the starting layer is less than 10 nm thick.

18. The method according to claim 1, wherein the anti-crystallization dopant keeps the lower silicon layer amorphous during heating the substrate to the temperature above 500° C.

19. The method according to claim 1, further comprising:
  anisotropically etching the lower amorphous silicon layer through open portions between the vertical portions of the second conformal layer;
  removing the remaining portions of the second conformal layer; and,
  anisotropical etching the substrate through the open portions of the lower amorphous silicon layer thereby patterning the substrate.

20. A method of forming a semiconductor device, comprising:
  patterning a substrate, wherein patterning the substrate comprises, in order:
    forming a lower hard mask layer on the substrate;
    providing a lower amorphous silicon layer above the lower hard mask layer, the lower amorphous silicon layer comprising an anti-crystallization dopant;
    forming an upper hard mask layer above the lower amorphous silicon layer by a method comprising heating the substrate to a temperature above 550° C.;
    providing an upper amorphous silicon layer above the upper hard mask layer;
    providing a photoresist film above the upper amorphous silicon layer;
    exposing and developing the photoresist film to form a photoresist pattern;
    anisotropically etching the photoresist pattern into the upper amorphous silicon layer;
    depositing a first conformal layer over exposed surfaces and over the substrate;
    anisotropically etching the first conformal layer to remove horizontal portions of the first conformal layer while leaving vertical portions of the first conformal layer at sidewalls of patterned features in the upper amorphous silicon layer;
    removing the upper amorphous silicon layer;

anisotropically etching the upper hard mask through open portions between the vertical portions of the first conformal layer;

removing remaining portions of the first conformal layer;

anisotropically etching the lower amorphous silicon layer through open portions of the upper hard mask layer;

removing the upper hard mask layer;

depositing a second conformal layer over exposed surfaces at the surface of the substrate;

anisotropically etching the second conformal layer to remove the horizontal portions of the second conformal layer while leaving the vertical portions of the second conformal layer;

removing the lower amorphous silicon layer;

anisotropically etching the lower hard mask through open portions between the vertical portions of the second conformal layer;

removing remaining portions of the second conformal layer; and anisotropically etching the substrate through open portions of the lower hard mask layer.

21. A semiconductor device formed by a method according to claim 1 or 20.

* * * * *

UNITED STATES PATENT AND TRADEMARK OFFICE
CERTIFICATE OF CORRECTION

PATENT NO. : 10,453,685 B2
APPLICATION NO. : 15/476752
DATED : October 22, 2019
INVENTOR(S) : Kelly Houben et al.

Page 1 of 1

It is certified that error appears in the above-identified patent and that said Letters Patent is hereby corrected as shown below:

In the Specification

In Column 5, Line 17, delete "2 at %" and insert --2 at. %--.

In Column 6, Line 20, delete "2 at %" and insert --2 at. %--.

In Column 6, Lines 52-53, delete "500 C" and insert --500° C.--.

In Column 7, Line 11, delete "2.5 at %" and insert --2.5 at. %--.

In Column 7, Line 18, delete "2 at %" and insert --2 at. %--.

In Column 8, Line 22, delete "(see FIG. 2i))," and insert --(see FIG. 2i),--.

In the Claims

In Column 9, Line 28, Claim 3, delete "at %," and insert --at. %,--.

Signed and Sealed this
Eighteenth Day of February, 2020

Andrei Iancu
*Director of the United States Patent and Trademark Office*